United States Patent [19]

Hemery et al.

[11] 4,374,364
[45] Feb. 15, 1983

[54] DARLINGTON AMPLIFIER WITH EXCESS-CURRENT PROTECTION

[75] Inventors: Jacques Hemery, Caen; Bernard P. Roger, Carpiquet, both of France

[73] Assignee: U.S. Philips Corporation, New York, N.Y.

[21] Appl. No.: 192,125

[22] Filed: Sep. 29, 1980

[30] Foreign Application Priority Data

Oct. 22, 1979 [FR] France .............................. 79 26168

[51] Int. Cl.³ .......................................... H02H 7/20
[52] U.S. Cl. .................................... 330/298; 330/307
[58] Field of Search .................... 330/207 P, 298, 307, 330/310

[56] References Cited

U.S. PATENT DOCUMENTS 3,564,443 2/1971 Nagata ............................... 330/307
3,988,693 10/1976 Seki ..................................... 330/298

Primary Examiner—James B. Mullins
Attorney, Agent, or Firm—Robert T. Mayer; Bernard Franzblau

[57] ABSTRACT

A Darlington amplifier comprising an auxiliary transistor (16) for overload protection. The base of the auxiliary transistor is connected to a tapping (17) provided on a resistor (12) included between the emitter and base of the output transistor (11) of the amplifier, which resistor assists in biassing said auxiliary transistor.

12 Claims, 6 Drawing Figures

DARLINGTON AMPLIFIER WITH EXCESS-CURRENT PROTECTION

The invention relates to an electronic device which comprises at least one amplifier constituted by a first or input transistor, which is coupled directly to a second or output transistor, the arrangement of said two transistors constituting an amplifier known as a DARLINGTON amplifier, a first resistor being connected in parallel with the base-emitter path of the second transistor, a second resistor being included in series in the emitter circuit of the second transistor and being connected to said emitter at a first end, said device also comprising a third transistor having a collector connected to the base of the first transistor and an emitter connected to the second end of the second resistor.

The invention more specifically, though not exclusively, relates to DARLINGTON amplifiers realized in integrated semiconductor form.

Low-frequency amplifiers are generally provided with means for protecting the output transistor/transistors against the effects of excess currents. Excess-current operation would result in excessive heating of said transistor/transistors, which would inevitably lead to its/their destruction.

A customary excess-current protection means in an amplifier is that used in the overload detector constituting the subject matter of U.S. Pat. No. 3,974,438. In the FIGURE illustrating this patent, a transistor designated (133) is shown having a collector-emitter path connected in parallel with a DARLINGTON amplifier constituted by two transistors (121, 101). A resistor (122) is included in series in the emitter circuit of the output transistor (101). The potential difference across the resistor (122) is employed for biasing the base-emitter junction of the transistor (133) via a divider bridge (131, 132). The transistor (133), which under normal operating conditions of the amplifier produces a specific maximum potential drop across the resistor (122), is cut off. In a condition of overloading the potential difference across said resistor (122) is then sufficient to make the transistor (133) conductive and at least a part of the input current is directly diverted to the output of the amplifier via said transistor (133), which provides the necessary reduction in the power developed in the output transistor (101).

This protection means, of which various modifications are described in patents, which modifications specifically relate to the voltage divider section disposed between the series resistor included in the emitter circuit of the output transistor and the base of the transistor which is connected in parallel with the two transistors of the DARLINGTON amplifier, is found to perform satisfactorily. Furthermore, it is simple.

However, simple though it is, it requires the use of several special resistors. Moreover, the ratios of the values of said resistors is required to be comparatively accurate if the amplifier is to be operated at its optimum power without ever exceeding the limit beyond which said amplifier may be damaged. These requirements become more important when such an amplifier is to be realized in integrated form.

The DARLINGTON amplifier proposed herein has been designed in order to simplify the protection circuit for the power transistor of said amplifier in comparison with equivalent circuits known from the prior art, specifically in order to facilitate integration of the complete device.

According to the invention an electronic device as defined in the preamble is characterized in that the base of said third transistor is connected to a tapping provided on said first resistor.

Said first resistor is even required in a DARLINGTON amplifier which does not comprise an overload protection device. It occurs for example in the circuit illustrating the said U.S. patent in which it is designated (127). By means of such a resistor a substantial portion of the leakage current of the first transistor—which current is large at high operating temperatures—can be diverted and is consequently not amplified by the second transistor.

Thus, the invention is based on the idea of employing said first resistor for two purposes, namely both for the amplifier section and for the protection section of the device.

Said resistor, which in accordance with the invention includes a tapping, constitutes a divider bridge for the voltage between the emitter and the base of the second transistor.

A fraction of said voltage contributes to the forward bias of the base-emitter junction of the third transistor, which fraction represents the substantially fixed portion of the bias voltage of said transistor. The other portion of the bias voltage is provided by the voltage drop produced across said second resistor which is included in series in the emitter circuit of the second transistor. This last-mentioned portion is variable since it is a function of the output current of the second transistor. Thus, like in the prior-art devices, it depends on the voltage drop across the resistor included in series in the emitter circuit of the output transistor whether the third transistor conducts or does not conduct. However, in the embodiment in accordance with the invention the bias voltage of said third transistor is not provided by said second resistor only. Its value may therefore be selected to be comparatively small relative to those normally used, so that the loss of power of the amplifier as a result of the presence of such a resistor can be reduced. This is an advantage of the invention in comparison with prior-art devices.

A second advantage of the invention is a simplification of the protection means in comparison with known means. Apart from said second resistor, the device in accordance with the invention does not comprise any resistors other than those which are indispensable for the operation of the amplifier itself. Moreover, because of its small value, said last-mentioned resistor need not be specially formed. The resistor (0.01 to 0.02$\Omega$) may be formed by the resistance of the metal wire which is soldered to the emitter output of the second transistor and which provides the conductive connection of this emitter to its load.

The protection means in accordance with the invention, which is of simple design, can readily be incorporated in a conventional integrated semiconductor structure which comprises at least one DARLINGTON amplifier. This is another advantage of the invention.

The integration of the third transistor, which protects the amplifier, presents no special problems. As regards the first resistor, it is already present—though without intermediate tapping—in prior-art integrated DARLINGTON amplifiers. The principle of forming said resistor, i.e. the provision of a very local shortcircuit between the emitter and base regions of the second transistor, remains applicable in the present case. It is merely necessary to adapt the topology of the resistor.

The present invention may be applied to DARLINGTON amplifiers comprising two transistors of the same type and also to amplifiers of this type in an inverse configuration, in i.e. which the input transistor and the output transistor are of opposite types. It also applies to electronic devices which for example comprise two DARLINGTON amplifiers operating as complementary circuits.

The invention will now be described in more detail with reference to the accompanying drawings in which.

Figure 1:
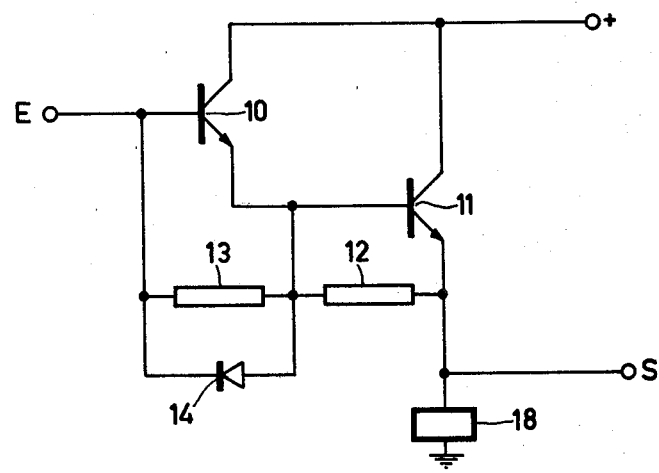
FIG. 1 represents the conventional circuit diagram of a DARLINGTON amplifier comprising two transistors of the same type, but without an overload protection circuit.

In the conventional circuit diagram of a DARLINGTON amplifier illustrated in FIG. 1 there is provided a first or input transistor 10 and a second or output transistor 11, which are both of the NPN type. In known manner, the emitter of the transistor 10 is connected to the base of the transistor 11 and the collectors of the two transistors are both connected directly to the positive terminal of the power supply. The emitter of the transistor 11 is connected to the circuit ground via a load impedance represented by the rectangle 18. Furthermore, a resistor 12 is connected in parallel with the base-emitter junction of the transistor 11. Another resistor 13 is connected in parallel with the base-emitter junction of the transistor 10 and a diode 14 is included in the reverse sense relative to said last-mentioned junction and serves to improve the switching speed of the circuit. The input of the amplifier is constituted by the terminal E which is connected to the base of the transistor 10, while the output of this amplifier is constituted by the terminal S, which is connected to the emitter of the transistor 11 before the load impedance 18.

Figure 2:
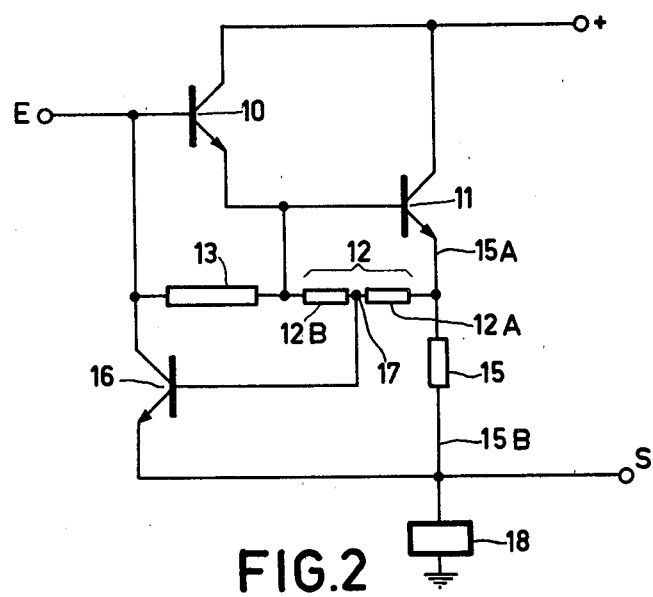
FIG. 2 represents the circuit diagram of a device comprising a DARLINGTON amplifier similar to that of FIG. 1, provided with an overload protection circuit in accordance with the invention.

Reference is now made to the diagram of FIG. 2. One part of this diagram shows the DARLINGTON amplifier as described in the foregoing with reference to FIG. 1 (except for the diode 14). Corresponding elements in the FIGS. 1 and 2 bear the same reference numerals.

FIG. 2 moreover shows the elements which constitute the protection circuit of the amplifier.

According to the invention the electronic device shown in FIG. 2 comprises at least one amplifier constituted by a first or input transistor 10, which is coupled directly to a second or output transistor 11 (of the same type as the first transistor), the arrangement of said two transistors constituting an amplifier known as a DARLINGTON amplifier. A first resistor 12 is connected in parallel with the base-emitter path of the second transistor 11 and a second resistor 15 is included in series in the emitter circuit of the second transistor 11 and is connected to said emitter at a first end 15A. This device also comprises a third transistor 16, having a collector connected to the base of the first transistor 10 and an emitter connected to the second end 15B of the second resistor 15. The electronic device is characterized in that the base of said third trnasistor 16 is connected to a tapping 17 provided on said first resistor 12.

Thus, the resistor 12 is divided into two parts 12A and 12B. Said resistor 12 performs two functions in the device of FIG. 2;

on the one hand, connected in parallel with the base-emitter path of the transistor 11, it provides a path for diverting leakage currents of the transistor 10 and thus ensures that said currents are not amplified by said transistor 11, on the other hand, with its part 12A in series with the resistor 15, connected in parallel with the base-emitter path of the transistor 16, it assists in foward biassing the base-emitter junction of this transistor.

The protection circuit of the amplifier then operates as follows:

The base-emitter bias voltage $V_1+V_2$ of the transistor 16 is equal to the sum of the potential difference $V_1$ across the part 12A of the resistor 12 (which difference is a fraction equal to $R_{12A}/(R_{12A}+R_{12B})$ of the base-emitter voltage of the transistor 11, $R_{12A}$ and $R_{12B}$ being the respective resistance values of the parts 12A and 12B of resistor 12) and the potential difference $V_2$ produced across the resistor 15 by the output current I of the amplifier. $V_1$ is substantially constant, whereas $V_2$ varies with I.

During normal operation of the amplifier the sum $V_1+V_2$ is smaller than the base-emitter threshold voltage of the transistor 16 and this transistor is cut off.

If the current I exceeds a given level which is regarded as the maximum level above which the transistor 11 is likely to be damaged, the voltage drop $V_2$ across the resistor 15 reaches a value such that the sum $V_1+V_2$ exceeds said threshold voltage and the transistor 16 is turned on. Thus it diverts a part of the input current directly to the amplifier output, which causes a decrease of I and subsequently a decrease of $V_2$, so that transistor 16 is turned off again.

The operation of the amplifier is never interrupted; only its power is limited.

It is evident that although the operation of the circuit in accordance with the invention is substantially similar to that of other prior art protection circuits—specifically that of the circuit described in the said U.S. Pat. No. 3,974,438—the characteristic feature of the circuit in accordance with the invention resides in particular in the fact that the voltage divider, which assists in providing the bias voltage for the base-emitter junction of the transistor 16, is constituted by the resistor 12 which is connected in parallel with the base-emitter path of the output transistor 11. This feature enables the circuit design to be simplified in comparison with that of known embodiments.

The correct operation of the amplifier arrangement depends in particular on the correct choice of the values of the resistors 12A, 12B and 15. Depending on the situation and the value of the current I and the resistor 15, the ratio $R_{12A}/R_{12B}$ lies between 3 and 10. It is evident that for a correct adjustment practical tests are required. By way of indication some numerical values are given hereinafter which relate to a protection circuit in accordance with the invention for an amplifier whose current I during normal operation is limited to approximately 6 A:

the resistor 12 has a total value of approximately 100Ω, the parts 12A and 12B of said resistor respectively having values of 85 and 15Ω, the resistor 15 is of the order of 0.01Ω. This value is that of the gold-wire connection which connects the transistor 11 to the impedance 18 in the case of an integrated semiconductor device. This applies to connections of exact length which are mechanically cut and which are practically identical from one device to another.

the base-emitter voltage of the transistor 11 is approximately 800 mV, which yields a potential difference $V_1 = 660$ to 690 mV across the resistor part 12A.

For a current $I \simeq 6$ A, the voltage drop $V_2$ across the resistor 15 would be approximately 60 mV.

The threshold voltage of the transistor 16 is 700–750 mV. It appears that the sum $V_1 + V_2$ approximately corresponds to this voltage range and that the values proposed for the resistors 12 and 15 are suitable values, which in practice enable a correct adjustment, allowance being made for the comparatively large but inevitable tolerances of the resistors in integrated circuits.

For the sake of completeness it is to be noted that in the diagram of the device in accordance with the invention in FIG. 2, the collector-base diode of the transistor 16, in series with the part 12B of the resistor 12 (the part with a low resistance), is connected in parallel, in the reverse direction, with the base-emitter path of the input transistor 10. Thus, this diode improves the operation of the amplifier in respect of the switching speed, which is generally effected by means of a specific diode (the diode 14 in FIG. 1). Thus, it is no longer necessary to include the diode 14 and this is a practical advantage of the device in accordance with the invention, which also facilitates its integration.

Figure 3:
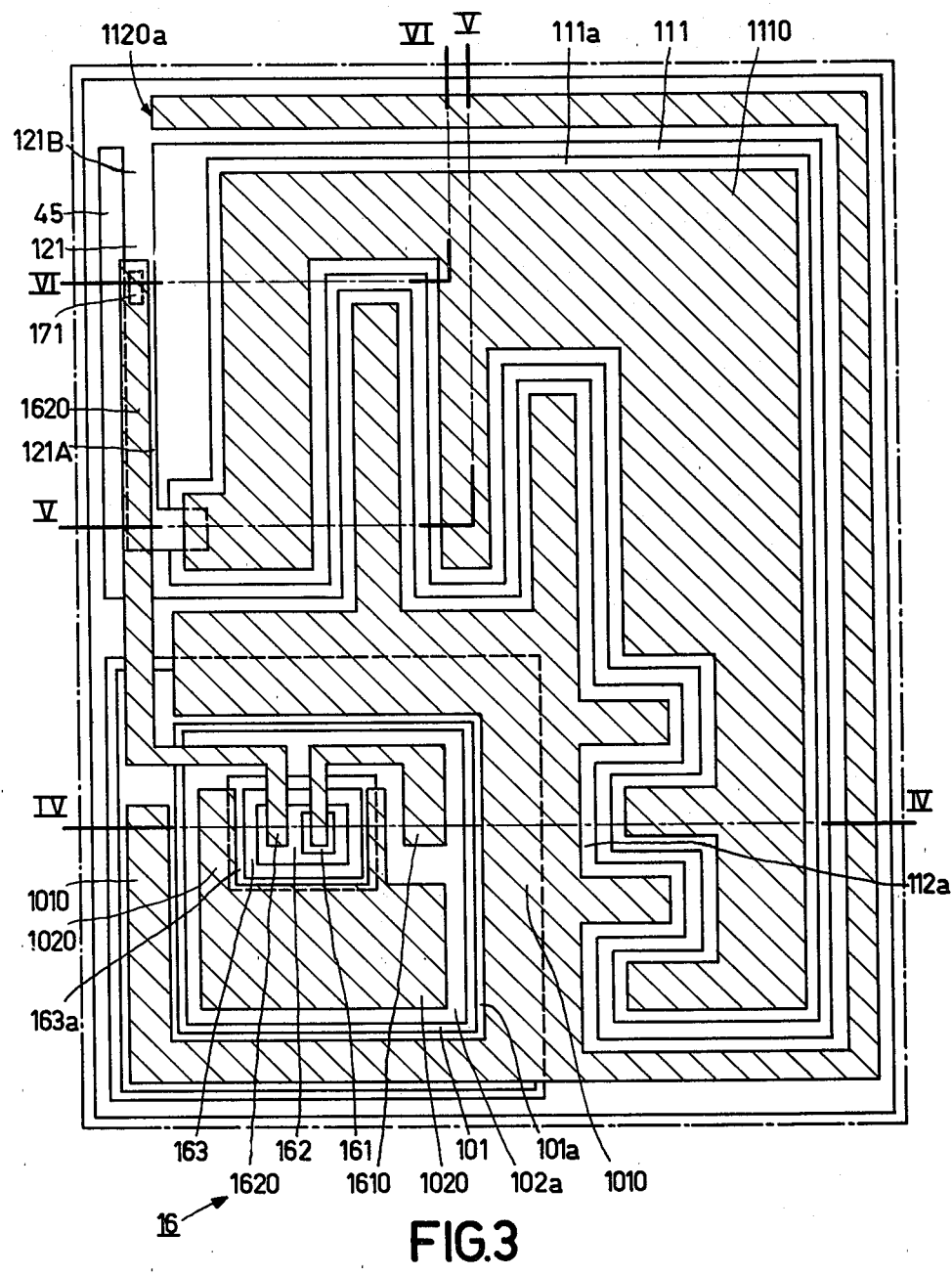
FIG. 3 is a plan view of an embodiment, in mesa-structure, of a DARLINGTON amplifier provided with a protection circuit in accordance with the invention.
Figure 4:
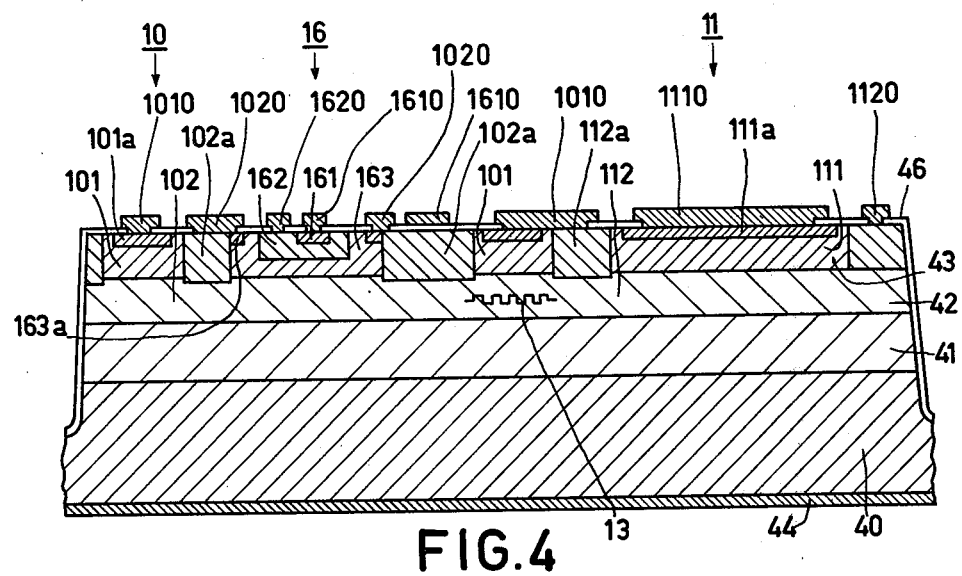
FIGS. 4, 5 and 6 are cross-sectional views taken on the lines IV—IV, V—V and VI—VI respectively in FIG. 3.
Figure 5:
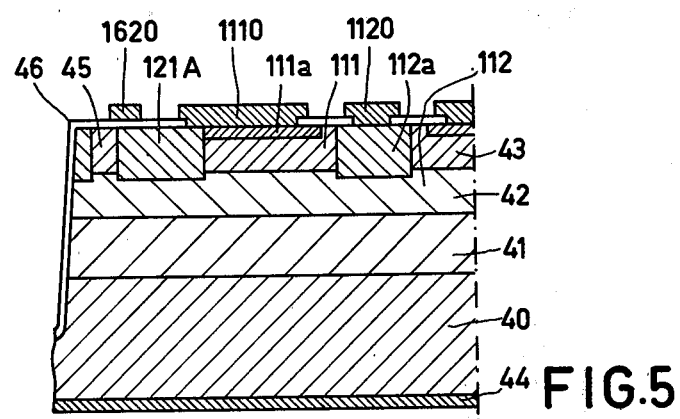
Figure 6:
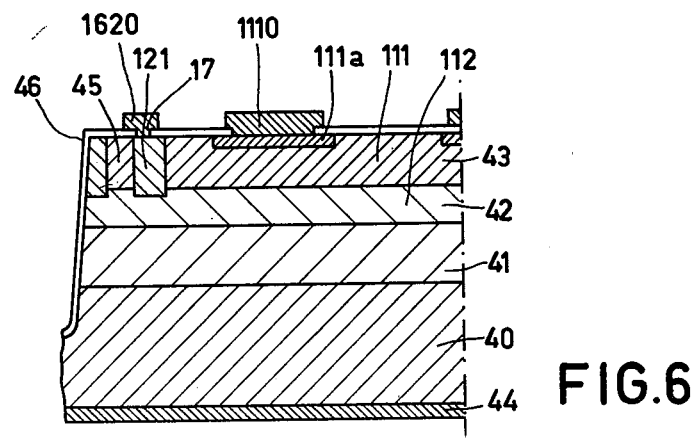

Reference is now made to FIG. 3, as well as to the cross-sectional views of FIGS. 4, 5 and 6.

The integrated DARLINGTON amplifier shown in these Figures is formed on a heavily doped N-type silicon substrate 40 provided with three successive epitaxial layers: a lightly doped N-type first layer 41, a lightly doped P-type second layer 42, and a lightly doped N-type third layer 43.

The layer 41 constitutes the common collector of the transistors 10 and 11, the connection being established by the common substrate 40 covered with a metallic contact zone 44.

The epitaxial layer 43 is divided into compartments by walls of a P-type material, which are obtained by the diffusion through said layer 43 and which at the same time constitute the base contacts on the underlying layer 42.

For a better understanding of FIG. 3 it is to be noted that the input transistor 10 and the transistor 16 are located in the lower left-hand quarter of this Figure, whereas the output transistor 11 occupies the upper and lower right-hand quarters and part of the upper left quarter of the same Figure. The resistor 12 is located in the upper left quarter and extends parallel to the left-hand edge of said FIG. 3. This is an advantageous arrangement, though it is not imperative.

The base of the input transistor 10 is formed by a portion 102 of the layer 42. Said base is connected to the surface by the base contact 102a. The emitter of this transistor is situated in a portion 101 of the layer 43, contact being established by a contact zone 101a provided on the surface of the semiconductor crystal. The contact points on the base 102 and on the emitter 101 are respectively constituted by metal zones 1020 and 1010.

The base of the transistor 11 is constituted by a portion 112 of the layer 42. This base is connected to the surface by the base contact 112A. The emitter of the transistor 11 occupies a portion 111 of the layer 43, contact being established by a contact one 111a. Metal zones 1120 and 1110 provide the contact points with the base 112 and the emitter 111 respectively.

The transistor 16, which protects the circuit, is formed inside the transistor 10. Its collector 163 is formed in a part of the layer 43. The collector contact is provided by a peripheral surface zone 163a, which adjoins the base contact zone 102a of the transistor 10. The base 162 of said transistor 16 is situated inside the collector 163 and it surrounds the emitter 161 of the same transistor. Metallic zones 1620 and 1610 provide the contact with the base 162 and the emitter 161 respectively. Contact with the collector 163 is provided by the metal zone 1020 which already makes contact with the base 102 of the transistor 10. Thus the connection between the base of the transistor 10 and the collector of the transistor 16 is formed, in conformity with the drawing of the circuit of FIG. 2.

It is to be noted that the metal zone 1010 is superimposed on the emitter contact zone 101a of the transistor 10 and the base contact 112a of the transistor 11, thus providing a connection as shown in FIG. 2.

The resistor 13 of FIG. 2 is constituted by a portion of the layer 42 between the base contacts 102a and 112a. This resistor is schematically represented in FIG. 4.

The resistor 12 is formed by a narrow strip 121 of P-type material inserted in the emitter 111 of the transistor 11, between the main layer of said emitter, in which the emitter contact zone 111a is formed, and a narrow lateral zone 45.

At one end (side 121B) the strip 121 touches the edge 1120a (see FIG. 3) of the base contact of transistor 11. At its other end (side 121A), said strip 121 is connected to the emitter 111 of the transistor 11 by the metal zone 1110, which is designed so that very locally it rests on both elements, i.e. the emitter and the strip.

The metal zone 1620 extends from the base of the transistor 16 beyond the strip 121 with which it makes contact via a window 171 in order to form the tapping 17 shown in FIG. 2, which divides said strip 121 into two parts 121A and 121B which respectively correspond to the resistors 12A and 12B in FIG. 2.

The resistor 15 in the diagram of FIG. 2 is not shown in the drawings. It is constituted by the connection which is subsequently soldered to the metal zone 1110 and which leads to the corresponding output terminal of the casing of the integrated circuit. At the same time another connection is soldered to the emitter zone 1610 of the transistor 16, which also leads to said output terminal. This last-mentioned connection introduces a slight resistance which plays no part in the operation of the protection circuit and which in no way affects this operation.

For manufacturing a device as shown in FIGS. 3, 4, 5 and 6 use is made of the customary known techniques for the fabrication of semiconductors.

Starting from a N+ type silicon wafer doped with antimony in order to obtain a specific resistance of the order of 15 mΩ.cm, a first N-type epitaxial layer 41 is deposited, which is doped with arsenic in order to obtain a specific resistance of $\simeq 4$ to 8 ohm.cm, with a thickness of 15 to 20 μm. Subsequently, a second P-type epitaxial layer 42 is deposited, which is doped with borium in order to obtain a specific resistance of ≃5 to 9Ωcm, over a thickness of 14 to 18 μm. and finally a third N-type epitaxial layer 43 doped with arsenic in deposited in order to obtain a specific resistance of ≃3 to 6Ω.cm, having a thickness of 5 to 7 μm.

By photoetching a mask is formed whose windows correspond to the P+ walls, to the base contact zones of the transistors 10 and 11, and to the resistor 12 (strip 121). Subsequently a borium diffusion is formed in such a way that a diffusion depth of 7 μm is obtained, surface concentration of $5.10^{19}$ atoms per $cm^3$ and a specific resistance of 20 Ohms. The length of the resistor 12 will then be substantially equal to 5 times its width ($R_{12} \simeq 100\Omega$). Subsequently, a new mask is formed whose window corresponds to the base of the transistor 16 and a new borium diffusion is applied so as to obtain a diffusion depth of 3 to 4 μm, the concentration and resistance being substantially the same as specified for the preceding borium diffusion. Subsequently, by a phosphorus diffusion applied via a third mask, the emitter contact zones of the transistors 10 and 11 and the emitter and the collector contact zone of the transistor 16 are formed simultaneously. This is effected so that a diffusion depth of 2 to 2.5 μm is obtained, a surface concentration of the order of $5.10^{20}$ atoms per $cm^3$ and a specific resistance of 2Ω.

It is obvious that all the diffusion depths specified allow for the consecutive annealing operations to which the chip is subjected.

The device is finished by forming the contact windows in the oxide layer 46 which covers it, the application of an aluminum layer by vacuum deposition and finally etching said aluminum layer in order to form the various conductors and surface contact zones.

The example of a DARLINGTON amplifier equipped with NPN transistors shown in FIGS. 3 to 6 is nonlimitative. It would have been equally possible to describe an amplifier equipped with PNP transistors.

What is claimed is:

1. An amplifier device comprising a first transistor coupled directly to a second transistor, the arrangement so that said two transistors form a DARLINGTON amplifier, a first resistor connected in parallel with the base-emitter path of the second transistor, a second resistor connected in series in the emitter circuit of the second transistor and having a first end connected to said emitter of the second transistor and to one end of said first resistor, a third transistor having a collector connected to the base of the first transistor and an emitter connected to a second end of the second resistor, and means connecting the base of said third transistor to a tapping on said first resistor.

2. An amplifier device as claimed in claim 1, wherein the ratio of the resistance value of the part of said first resistor situated between said tapping and the emitter of the second transistor to the resistance value of the other part of said first resistor lies between 3 and 10.

3. An amplifier device as claimed in claims 1 or 2, characterized in that the resistance values of the part of said first resistor situated between said tapping and the emitter of the second transistor and of said second resistor are selected so that during normal operation of the amplifier the sum of the potential differences across said part of the first resistor and the second resistor are smaller than the base-emitter threshold voltage of the third transistor.

4. An amplifier device as claimed in claim 3, characterized in that said first resistor has a resistance value of approximately 100 ohms, that the two parts of said first resistor which are situated on either side of said tapping respectively have resistance values of approximately 85 ohms and 15 ohms, and that the second resistor has a resistance value of approximately 0.01 ohms.

5. An amplifier device as claimed in claim 1 formed as a monolithic semiconductor chip comprising, in the direction of its thickness and starting from the upper surface or active surface towards the lower surface, a first epitaxial layer of a first conductivity type in which are formed the emitter regions of the first and second transistors, a second epitaxial layer of a second conductivity type adjacent the first epitaxial layer and in which the base regions of the said transistors are formed, and wherein said first resistor is formed by a strip of a material of the second conductivity type formed in the epitaxial layer of the first conductivity type and which extends, in depth, up to the second epitaxial layer.

6. A monolithic semiconductor amplifier device as claimed in claim 5, wherein said third transistor is entirely situated in said first epitaxial layer of the first conductivity type.

7. An amplifier comprising first and second transistors connected together to form a DARLINGTON amplifier, a third transistor having a base, an emitter and a collector connected to the base of the first transistor, a first resistor having first and second terminals connected to base and emitter electrodes, respectively, of the second transistor, a second resistor having one end connected to a junction of the emitter of the second transistor and the second terminal of the first resistor and a second end connected to the emitter of the third transistor, and means connecting the base of the third transistor to a tapping on the first resistor.

8. An amplifier as claimed in claim 7, wherein said tapping on the first resistor divides said first resistor into first and second parts having a resistance ratio in the range of 3 to 10 and produces a bias voltage for the base-emitter junction of the third transistor such that the third transistor is cut-off during normal operation of the amplifier.

9. An amplifier comprising first and second transistors having collector electrodes coupled to a source of DC supply voltage, means connecting the emitter of the first transistor to the base of the second transistor, a first resistor connected across the base-emitter junction of the second transistor, a third transistor having a collector connected to the base of the first transistor, a second resistor, means connecting one end of said second resistor to the emitter of the second transistor and a second end of the emitter of the third transistor, and second means connecting the base of the third transistor to a tapping on the first resistor such that the base-emitter bias voltage of the third transistor is determined in part by the voltage drop across the second resistor and in part by the voltage drop across a part of the first resistor between said tapping and the emitter of the second transistor.

10. An amplifier as claimed in claim 9, wherein said tapping on the first resistor is chosen so that the bias voltage of the third transistor is equal to the sum of the voltage drops across the second resistor and said part of the first resistor and the third transistor is biased into cut-off during normal operation of the amplifier and turns on at a predetermined level of current flow in said second transistor thereby to limit said second transistor current flow.

11. An amplifier as claimed in claim 9, wherein said tapping divides said first resistor into first and second parts having a resistance ratio in the range of 3 to 10.

12. An amplifier as claimed in claim 9, wherein said first and second resistors are connected in a series circuit between the base of the second transistor and the emitter of the third transistor.

* * * * *

UNITED STATES PATENT AND TRADEMARK OFFICE
CERTIFICATE OF CORRECTION

PATENT NO. : 4,374,364
DATED : February 15, 1983
INVENTOR(S) : JACQUES HEMERY ET AL It is certified that error appears in the above—identified patent and that said Letters Patent is hereby corrected as shown below:

In the Claims:

Claim 1, line 2, delete ",the arrangement"

Claim 9, line 10, change "of" to --to-- first occurence

Signed and Sealed this

Twentieth Day of March 1984

[SEAL]

Attest:

GERALD J. MOSSINGHOFF

Attesting Officer

Commissioner of Patents and Trademarks